(12) United States Patent
Vetrò et al.

(10) Patent No.: US 8,912,614 B2
(45) Date of Patent: Dec. 16, 2014

(54) MAGNETIC TUNNEL JUNCTION DEVICES HAVING MAGNETIC LAYERS FORMED ON COMPOSITE, OBLIQUELY DEPOSITED SEED LAYERS

(75) Inventors: Francesco A. Vetrò, Sorianello (IT); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 270 days.

(21) Appl. No.: 13/294,287

(22) Filed: Nov. 11, 2011

(65) Prior Publication Data

US 2013/0119495 A1    May 16, 2013

(51) Int. Cl.
| | | |
|---|---|---|
| H01L 29/82 | (2006.01) | |
| H01L 21/00 | (2006.01) | |
| H01L 43/12 | (2006.01) | |
| H01L 27/22 | (2006.01) | |
| H01L 43/08 | (2006.01) | |

(52) U.S. Cl.
CPC ............... H01L 43/08 (2013.01); H01L 43/12 (2013.01); H01L 27/228 (2013.01)
USPC .. 257/421; 438/3; 257/E29.323; 257/E21.665

(58) Field of Classification Search
CPC ........ H01L 43/12; H01L 43/08; H01L 27/228
USPC .......... 257/E21.665, 421, E29.323, E21.002; 438/381, 382, 3
See application file for complete search history.

(56) References Cited

U.S. PATENT DOCUMENTS

| | | | |
|---|---|---|---|
| 4,767,516 A | 8/1988 | Nakatsuka et al. | |
| 6,815,244 B2 * | 11/2004 | Bottner et al. | 438/54 |
| 7,061,731 B2 | 6/2006 | Larson et al. | |
| 7,094,483 B2 | 8/2006 | Pelhos et al. | |
| 7,189,583 B2 | 3/2007 | Drewes | |
| 7,470,552 B2 * | 12/2008 | Drewes | 438/3 |
| 7,482,069 B2 * | 1/2009 | Sato | 428/831.2 |
| 7,566,507 B2 | 7/2009 | Abarra et al. | |
| 7,884,405 B2 * | 2/2011 | Drewes | 257/295 |
| 2004/0134060 A1 | 7/2004 | Carey et al. | |
| 2006/0003190 A1 * | 1/2006 | Abarra et al. | 428/832.1 |

(Continued)

OTHER PUBLICATIONS

Z. Lu et al., "Magnetic Anisotropy of FeCo Films Induced by Obliquely Sputtered Ru Underlayers," IEEE Transactions on Magnetics, Oct. 2009, pp. 4008-4010, vol. 45, No. 10.

(Continued)

*Primary Examiner* — William F Kraig
*Assistant Examiner* — Latanya N Crawford
(74) *Attorney, Agent, or Firm* — Vazken Alexanian; Ryan, Mason & Lewis, LLP

(57) ABSTRACT

Semiconductor stack structures such as magnetic tunnel junction structures having a magnetic free layer that is grown on composite, obliquely deposited seed layers to induce an increased in-plane magnetic anisotropy Hk of the magnetic free layer. In one aspect, a semiconductor device includes a composite seed layer formed on a substrate, and a magnetic layer formed on the composite seed layer. The composite seed layer includes a first seed layer obliquely formed with an incident angle from a surface normal of the substrate along a first direction of the substrate, and a second seed layer obliquely formed with the incident angle on the first seed layer along a second direction of the substrate, opposite the first direction.

21 Claims, 4 Drawing Sheets

(56) References Cited

U.S. PATENT DOCUMENTS

| | | | |
|---|---|---|---|
| 2007/0059564 A1* | 3/2007 | Klemmer et al. | 428/848.3 |
| 2008/0037407 A1* | 2/2008 | Takahashi et al. | 369/288 |
| 2008/0170329 A1* | 7/2008 | Thangaraj et al. | 360/131 |
| 2010/0128518 A1 | 5/2010 | Min | |
| 2012/0015099 A1* | 1/2012 | Sun et al. | 427/129 |
| 2012/0046164 A1* | 2/2012 | Tanaka et al. | 502/319 |
| 2013/0071692 A1* | 3/2013 | Covington et al. | 428/815 |

OTHER PUBLICATIONS

J.Z. Sun et al., "Spin Angular Momentum Transfer in a Current-Perpendicular Spin-Valve Nanomagnet," Quantum Sensing and Nanophotonic Devices, Invited Paper, Procedures of SPIE, Jan. 2004, pp. 445-455, vol. 5359.

K.-I. Hirata et al., "Ru/FeCoB Double Layered Film with High In-Plane Magnetic Anistropy Field of 500 Oe," Journal of Applied Physics, 53rd Annual Conference on Magnetism and Magnetic Materials, Apr. 2009, 3 pp., vol. 105.

* cited by examiner

MAGNETIC TUNNEL JUNCTION DEVICES HAVING MAGNETIC LAYERS FORMED ON COMPOSITE, OBLIQUELY DEPOSITED SEED LAYERS

TECHNICAL FIELD

This invention relates generally to magnetic tunnel junction (MTJ) structures for use with electronic components such as spin torque MRAM (magnetoresistive random access memory) and other magnetoresistive structures and more specifically, to magnetic tunnel junction structures having a magnetic free layer that is grown on composite, obliquely deposited seed layers to induce an increased in-plane magnetic anisotropy of the magnetic free layer for MTJ structures.

BACKGROUND

As is known in the art, a basic component of an MTJ device is a sandwich of two thin ferromagnetic (and/or ferrimagnetic) layers (magnetic free layer and a magnetic pinned layers) separated by a very thin insulating layer (tunnel barrier layer) through which electrons can tunnel. The tunneling current is typically higher when the magnetic moments of the magnetic free and pinned layers are parallel (oriented in same direction) and lower when the magnetic moments of the magnetic free and pinned layers are anti-parallel (oriented in opposite directions). The change in conductance for these two magnetic states can be described as a magnetoresistance. In general, the tunneling magnetoresistance (TMR) of an MTJ is defined as $(R_{AP}-R_P)/R_P$ where $R_P$ and $R_{AP}$ are the resistance of the MTJ for parallel and anti-parallel alignment of the magnetic free and pinned layers, respectively.

In general, spin torque MRAM (Magnetoresistive random access memory) is a 2-terminal device that utilizes a magnetic tunnel junction stack to provide a non-volatile memory. An MRAM memory cell comprises a magnetoresistive structure that stores a magnetic moment that is switched between two directions corresponding to two data states ("1" and "0"). In an MRAM cell, information is stored in magnetization directions of a free magnetic layer with the magnetization of the pinned layer maintained in a fixed direction. In a conventional spin-transfer MRAM memory cell, the data state is programmed to a "1" or to a "0" by forcing a write current directly through the stack of layers of materials that make up the MRAM cell.

For example, with the magnetization of the magnetic pinned layer in a fixed direction, a current passed in one direction through the magnetic tunnel junction makes the magnetic free layer parallel to the magnetic pinned layer (low resistance state), while a current passed through the magnetic tunnel junction in the opposite direction makes the magnetic free layer anti-parallel to the magnetic pinned layer pinned layer (high resistance state). A smaller current (of either polarity) is used to read the resistance of the device, which depends on the relative orientations of the free and pinned layers.

Spin torque MRAM technology faces several challenges before it can become practical for manufacture and implementation of MRAM memory devices A key issue is the need to reduce the write current needed to switch the MTJ structure of the MRAM device between low and high resistive states (between logic low and high levels). A simple single domain model as discussed below provides guidance on optimum material parameters for spin torque MRAM. For example, a formula for the switching voltage has been derived as follows:

$$V_{CO} = \frac{2q}{\hbar} \frac{RA\alpha M_s t}{\eta_{sp}} [H_k + 2\pi M_s]$$

$$E_a = \frac{1}{2} M_s t A H_k$$

(see J. Z. Sun et, al, "Spin Angular Momentum Transfer in a Current-Perpendicular Spin-Valve Nanomagnet," Proc. SPIE Vol. 5359, pp. 445-455, in Quantum Sensing and Nanophotonic Devices, edited by Manijeh Razweghi, Gail J. Brown (SPIE, Bellingham, Wash., 2004)).

In the above equations, $V_{CO}$ denotes a switching voltage threshold and wherein $E_a$ denotes an activation energy. In the above equations, the parameter q denotes electron charge, h is planck's constant, RA denotes a resistance-area product of the tunnel barrier, $\alpha$ is a magnetic damping factor, $M_s$ denotes a magnetization of the magnetic free layer, t denotes a thickness of the magnetic free layer, $\eta_{sp}$ denotes the spin polarization, $H_k$ denotes an in-plane uniaxial anisotropy, and $2\pi M_s$ is the half the easy-plane anisotropy.

In the above equations, it is desirable to reduce the value of $V_{CO}$ while maintain the activation energy $E_a$ large enough to prevent spontaneous fluctuations between the different states due to thermal fluctuations and provide a long memory lifetime, e.g., 10 years. In the equation for $V_{CO}$, the value of $$\frac{2q}{\hbar}$$

is a constant that does not change. The value of RA depends on the thickness of the tunnel barrier. However, the tunnel barrier cannot be made too thin because of potential damage or breakdown (hole formation) of the material layer. The value of $\eta_{sp}$, the spin polarization, is a value that ranges from 0-1, and cannot be larger than 1. The value of the magnetic damping, $\alpha$, can be controlled but cannot be made too small, as the magnetic device can oscillate/ring. In this regard, it is not feasibly practical to reduce the values of $$\frac{2q}{\hbar}$$

or RA or $\alpha$ to reduce $V_{CO}$.

The values of the activation energy $E_a$ and $V_{CO}$ are both directly proportional to the values of t (thickness of the magnetic free layer) and $H_k$ (in-plane uniaxial anisotropy). One way to decrease $V_{CO}$ is to reduce the thickness, t, of the magnetic free layer. However, a reduction in the thickness, t, of the magnetic free layer, will result in a reduced activation energy $E_a$, which is undesirable. However, by simultaneously decreasing t and increasing the value of $H_k$, the value of the activation energy $E_a$ can be maintained high, while reducing the value of $V_{CO}$.

Indeed, although the value of $V_{CO}$ depends on the value of $H_k$, the value of $H_k$ has greater effect on the value of the activation energy $E_a$ than $V_{CO}$. This is because the value $[H_k+2\pi M_s]$ determines the switching voltage, and $H_k$ typically is of the order 100 Oe and $2\pi M_s$ is of order 10,000 Oe, so that the switching voltage is dominated by the $2\pi M_s$ term. So increasing the value of $H_k$ results in a greater increase of $E_a$ than $V_{CO}$, relatively speaking. In this regard, one method to reduce $V_{CO}$ while maintaining the activation energy Ea relatively constant is to simultaneously reduce t and increase $H_k$.

SUMMARY OF THE INVENTION

Aspects of the invention include stack structures such as magnetic tunnel junction structures having a magnetic free layer that is grown on composite, obliquely deposited seed layers to induce an increased in-plane magnetic anisotropy Hk of the magnetic free layer.

In one aspect of the invention, a semiconductor device includes a composite seed layer formed on a substrate, and a magnetic layer formed on the composite seed layer. The composite seed layer includes a first seed layer obliquely formed with an incident angle from a surface normal of the substrate along a first direction of the substrate, and a second seed layer obliquely formed with the incident angle on the first seed layer along a second direction of the substrate, opposite the first direction. In other aspects of the invention, the incident angle is about 15 degrees to about 25 degrees. The first and second seed layers are formed of a material, such as Ruthenium, having a HCP (hexagonal close packed) crystalline structure with a long c-axis. The magnetic layer is formed of a composition of Co (Cobalt) and Fe (Iron).

In another aspect of the invention, a magnetic tunnel junction device includes a composite seed layer formed on a substrate, a magnetic free layer formed on the composite seed layer, a tunnel barrier layer formed on the magnetic free layer, and a second magnetic layer disposed over the tunnel barrier layer. The composite seed layer includes a first seed layer obliquely formed with an incident angle from a surface normal of the substrate along a first direction of the substrate, and a second seed layer obliquely formed with the incident angle on the first seed layer along a second direction of the substrate, opposite the first direction.

These and other aspects, features and advantages of the present invention will become apparent from the following detailed description of preferred embodiments, which is to be read in conjunction with the accompanying figures.

DETAILED DESCRIPTION OF THE PREFERRED EMBODIMENTS

Figure 1:
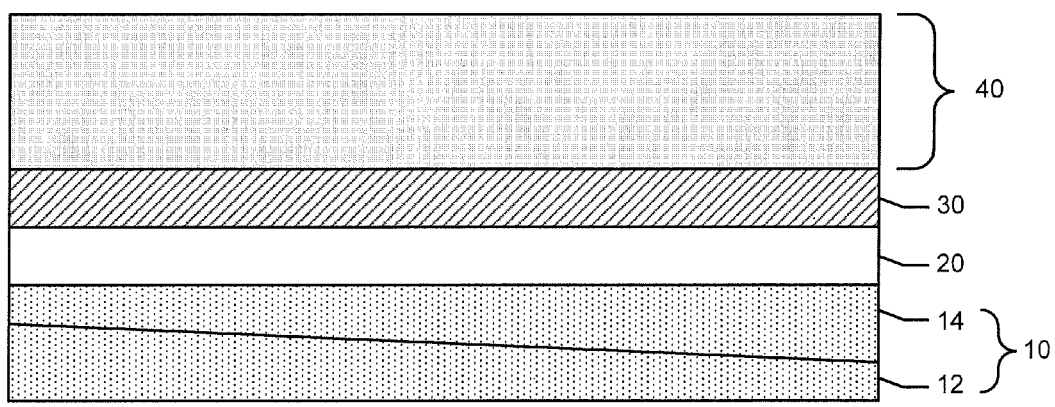
FIG. 1 is a cross-sectional view of a stack structure comprising a magnetic free layer according to an aspect of the invention.

Preferred embodiments of the invention will now be described in further detail with reference to semiconductor stack structures and magnetic tunnel junction (MTJ) structures that are constructed having a magnetic free layer formed on composite, obliquely deposited seed layers, which results in increased in-plane magnetic anisotropy of the magnetic free layer.

It has been previously reported that a large in-plane anisotropy can be induced in a magnetic free layer in a stack structure formed by obliquely depositing a seed layer of Ru (ruthenium) at a large incidence angle of 60 degrees (angle between the incident beam and the surface normal of the substrate), followed by depositing magnetic material consisting of Fe90Co10 or Fe10Co90, and followed by depositing a Ru cap layer. See Z. Lu, et al. "*Magnetic Anisotropy of FeCo Films induced by Obliquely Sputtered Ru Underlayers,*" IEEE Trans. Mag. 45, 4008 (2009). In practice, construction of this magnetic stack structure is not practical for spin torque MRAM fabrication because existing commercial deposition equipment does not allow deposition at 60 degrees from normal. Indeed, practically speaking, the deposition rate from such a high angle is very low, which is undesirable from a manufacturing standpoint. Moreover, the deposition of an obliquely deposited seed layer results in a non-planar stack structure, which can be problematic with regard to subsequent semiconductor processing steps, as is understood by those of ordinary skill in the art.

In accordance with aspects of the invention, through experimentation, we found that a large in-plane anisotropy in a magnetic free layer can be induced by growing a magnetic film on top of two seed layers of Ru that are deposited obliquely on top of each other at an angle of 25 degrees or less (from the surface normal), but in opposite directions. The composite seed layer increases the induced anisotropy in a magnetic free layer grown on the composite seed layer, and simultaneously provides a roughly uniform thickness seed for the magnetic free layer to be grown on, instead of having one edge of the wafer be thicker than the other due to the oblique deposition of a single seed layer. From a manufacturing standpoint, an oblique deposition angle of 25 degrees or less is practical for use in fabricating MTJ structures because a 25 degree oblique deposition angle is a standard angle in existing deposition equipment, for example in a 5PVD chamber of a Anelva C7100 deposition tool. In other aspects of the invention, we found that using a composition of CoFe, such as Co50Fe50, and using a MgO cap on the magnetic free layer instead of a Ru cap, results in a MT stack structure with a magnetic free layer that can be reduced in thickness, while providing high magnetic in-plane anisotropy, and thus providing desirable values for $V_{CO}$ (switching voltage threshold) and $E_a$ (activation energy) for practical use in MRAM frameworks, for example. Exemplary embodiments of stack structures, such as MTJ stack structures, for use with, e.g., MRAM will now be discussed in detail with reference to exemplary structures depicted in FIGS. 1, 2 and 3.

FIG. 1 is a cross-sectional view of semiconductor stack structure comprising a magnetic free layer according to an aspect of the invention, In particular, FIG. 1 shows a semiconductor stack structure 100 comprising a composite seed layer 10, a magnetic free layer 20, and a cap layer 30, which may be a tunnel barrier. The stack structure 100 may further include a stack of additional layers 40 comprising at least one additional magnetic pinned layer and other layers, providing a single magnetic tunnel junction stack framework. In other exemplary embodiments, the additional stacked layers 40 may include two or more magnetic layers and two or more tunnel barrier layers, and other layers that are commonly implemented to construct other types of magnetic tunnel junction structures such as double magnetic tunnel junction structures.

The composite seed layer 10 comprises a first seed layer 12 and a second seed layer 14. The first seed layer 12 is obliquely deposited onto a substrate layer at an incident angle (angle between incident beam and surface normal of substrate) in a first direction (−x direction), and the second seed layer 14 is obliquely deposited at the same incident angle in a second direction (+x direction), opposite the first direction. In a preferred embodiment, the incident angle of sputtering is about 15 degrees to about 25 degrees from the surface normal of the substrate. It is to be understood, however, an incident angle of sputtering which is higher than 25 degrees from the surface normal is preferable to achieve higher anisotropy.

In one exemplary embodiment, the seed layers 12 and 14 are formed by sputtering a material having a HCP (hexagonal close packed) crystalline structure with a long c-axis. In one preferred embodiment, the seed layers 12 and 14 are formed by obliquely sputtering two Ru (Ruthenium) layers on top of each other, in opposite directions. Other HCP materials that may be implemented as the seed layers include, for example, Ti (Titanium), Zr (Zirconium), Hf (Hafnium), Y (Yttriurnm), Sc (Scandium), Zn (Zinc), Os (Osmium), and Re (Rhenium).

The magnetic free layer 20 is formed by normal-incidence sputtering of a magnetic material onto the composite seed layer 10. The magnetic free layer 20 may be formed of an alloy comprising one or more materials such as Ni (Nickel), Fe (Iron) and Co (Cobalt) materials. For instance, the magnetic free layer 20 may be formed of NiFe or CoFe. In other exemplary embodiments, the magnetic free layer 20 may be formed of CoFeB. In one preferred embodiment, the magnetic free layer 20 is formed of Co50Fe50, although in other exemplary embodiments, the magnetic free layer 20 may be formed of Co25Fe75 or Co75Fe25. Furthermore, in a preferred embodiment, the cap layer 30 is formed of MgO (Magnesium Oxide).

Through experimentation with different magnetic stack structures, we found that high magnetic anisotropy can be induced in a Co50Fe50 magnetic film deposited by normal-incidence sputtering on top of a composite Ru seed layer, wherein the composite Ru seed layer is grown by obliquely sputtering two separate layers of Ru material with an incidence angle (angle between the incident beam and surface normal of the substrate) of 25 degrees, in opposite directions, and with an MgO layer formed on top of the Co50Fe50 magnetic film.

Figure 4A:
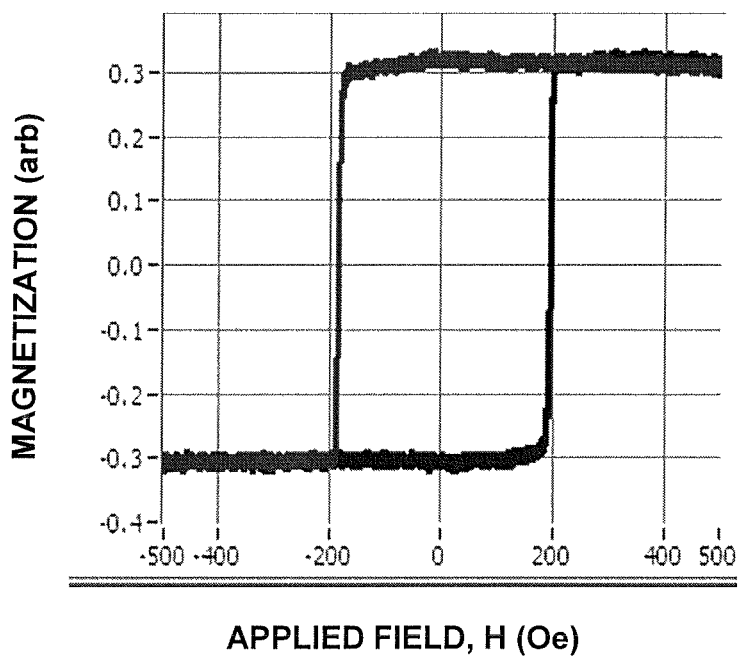
FIG. 4A is a plot of easy axis Kerr measurements of an experimental stack structure comprising a composite seed layer, a magnetic free layer and a cap layer designed according to principles of the invention.
Figure 4B:
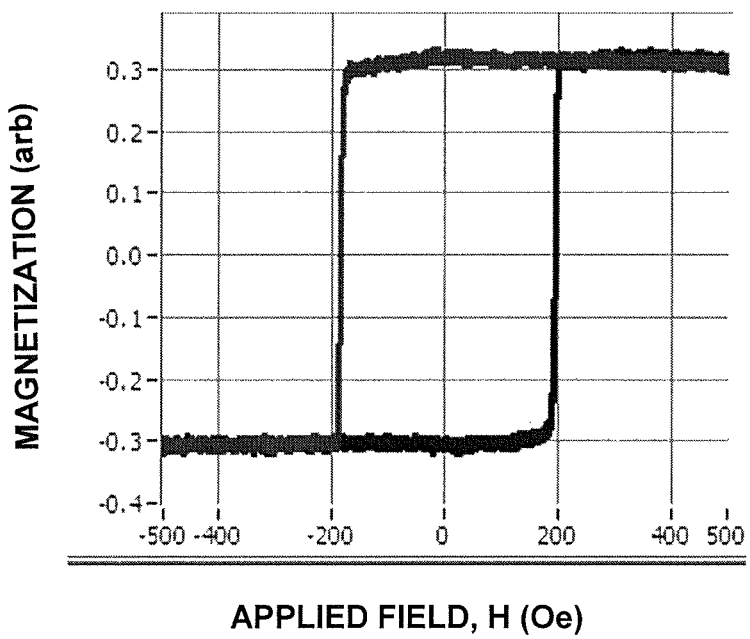
FIG. 4B is a plot of hard axis Kerr measurements of the experimental stack structure comprising a composite seed layer, a magnetic free layer and a cap layer designed according to principles of the invention.

FIGS. 4A and 4B are plots of actual in-plane easy axis and hard axis Kerr measurements of an experimental stack structure comprising a composite seed layer, a magnetic free layer and a cap layer designed according to principles of the invention. More specifically, FIGS. 4A and 4B show an easy axis hysteresis loop and hard axis hysteresis loop, respectively, of an experimental semiconductor stack structure as discussed above comprising a composite, obliquely deposited Ru/Ru seed layer, with Co50Fe50/MgO layers formed on the Ru/Ru seed layer, after annealing at 400 degrees Celsius. In FIGS. 4A and 4B, the y-axis represent represents Kerr measurements of magnetization in arbitrary units. The x-axis represents the applied magnetic field, H in units of Oe. In FIG. 4A, we measured the magnetization (y-axis) as a function of the applied field in the in-plane easy axis direction of the magnetic fee layer. In FIG. 4B, the x-axis represents an applied field in the in-plane hard axis direction (orthogonal to the easy axis). In general, the Kerr measurements show that the experimental magnetic stack structure exhibits a square hysteresis curve in the easy axis direction (FIG. 4A) and a very high in plane uniaxial anisotropy with a closed hysteresis loop and well defined saturation field in the hard axis direction (FIG. 4B).

Figure 2:
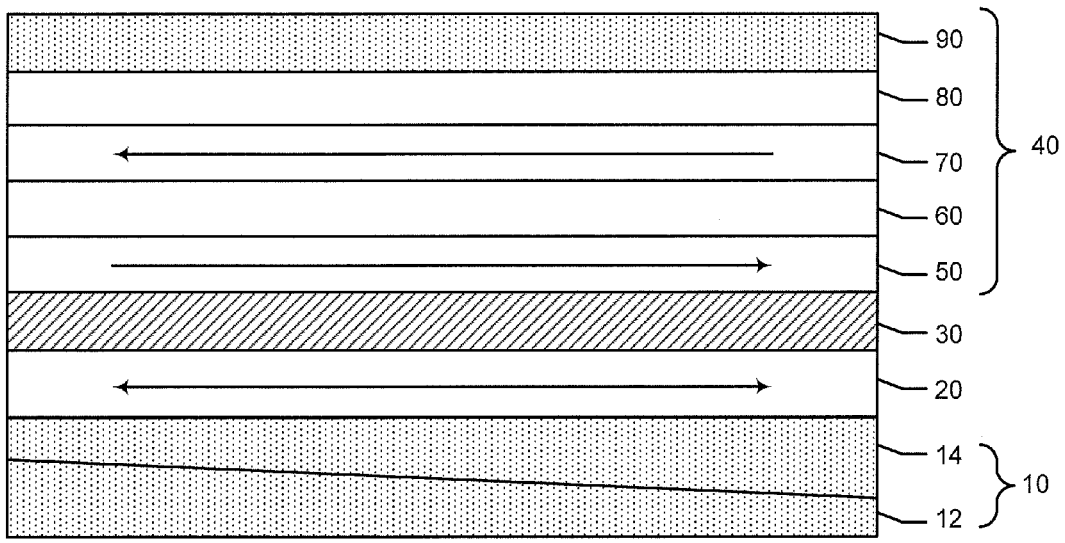
FIG. 2 is a cross-sectional view of a magnetic tunnel junction device that is constructed based on the stack structure of FIG. 1, according to an aspect of the invention.

FIG. 2 is a cross-sectional view of a magnetic tunnel junction device that is constructed based on the stack structure of FIG. 1, according to an aspect of the invention. In particular, FIG. 2 shows a magnetic tunnel junction device 200 comprising a composite seed layer 10, a magnetic free layer 20, and a tunnel barrier layer 30, similar to the MTJ structure 100 described above with regard to FIG. 1, except that FIG. 2 illustrates various layers 50, 60, 70, 80 and 90, which may be used to construct the generic stack 40 depicted in FIG. 1. In the exemplary embodiment of FIG. 2, the stack 40 comprises a first magnetic pinned layer 50 (or reference layer) formed on the tunnel barrier layer 30, a coupling layer 60 formed on the first magnetic pinned layer 50, a second magnetic pinned layer 70 formed on the coupling layer 60, an antiferromagnetic layer 80 formed on the second magnetic pinned layer 70, and a cap layer 90 (electrode).

In one aspect of the invention, the composite seed layer 10 comprises two layers of Ru, obliquely deposited at an angle of about 25 degrees in opposite directions, and each having a thickness of about 30 angstroms. The magnetic free layer 20 is preferably formed of CoFe. In one preferred embodiment, the magnetic free layer 20 is formed on Co50Fe50 with a thickness of about 15 angstroms. The tunnel barrier layer 30 is preferably formed on magnesium oxide (MgO) with a thickness of about 10 angstroms.

The first magnetic pinned layer 50 (or reference layer) and second pinned magnetic layer 70 are preferably formed of a magnetic material including at least one of cobalt (Co) or iron (Fe) or boron (B), or any combination thereof. In a preferred embodiment, the first magnetic pinned layer 50 is a reference layer that is formed of stack of layers comprising a layer of Fe (about 5 angstroms), and layer of CoFeB (about 15 angstroms) and a layer of CoFe (about 15 angstroms), although the first magnetic pinned layer 50 may be formed of other suitable combinations of materials and thicknesses. Furthermore, in one preferred embodiment, the second magnetic pinned layer 70 is formed of a layer of CoFeB (about 15 angstroms) and a layer of CoFe (about 15 angstroms), although the second magnetic pinned layer 70 may be formed of other suitable combinations of materials and thicknesses.

The coupling layer 60 is formed of a material, such as Ru, which couples the two magnetic pinned layers 50 and 70 on the top and bottom of the coupling layer 60. The coupling layer 60 ensures that magnetization of the first magnetic pinned layer 50 (the reference layer) is anti-parallel to the magnetization of the second magnetic pinned layer 70, such as shown in FIG. 2. The antiferromagnetic layer 80 is preferably made of PtMn (platinum manganese) or any other suitable material, which can pin the magnetic orientation of the ferromagnetic film forming the second magnetic pinned layer 70. In one preferred embodiment, the antiferromagnetic layer 80 is preferably made of PtMn with a thickness of about 200 angstroms. As is known, antiferromagnets can couple to ferromagnets, for instance, through a mechanism known as exchange anisotropy (for, example, wherein an aligning magnetic field is applied either when a ferromagnetic film is grown upon the antiferromagnet or during subsequent annealing) causing the surface atoms of the ferromagnet to align with the surface atoms of the antiferromagnet. This provides the ability to pin the orientation of a ferromagnetic film.

The cap layer 90 may be formed of one or more of tantalum (Ta), copper (Cu) or Ru, or other suitable capping materials. In one preferred embodiment, the cap layer 90 is formed of stack of layers comprising a layer of TaN (about 40 angstrom), a layer of Cu (about 300 angstroms) and Ru (about 70 angstroms).

Figure 3:
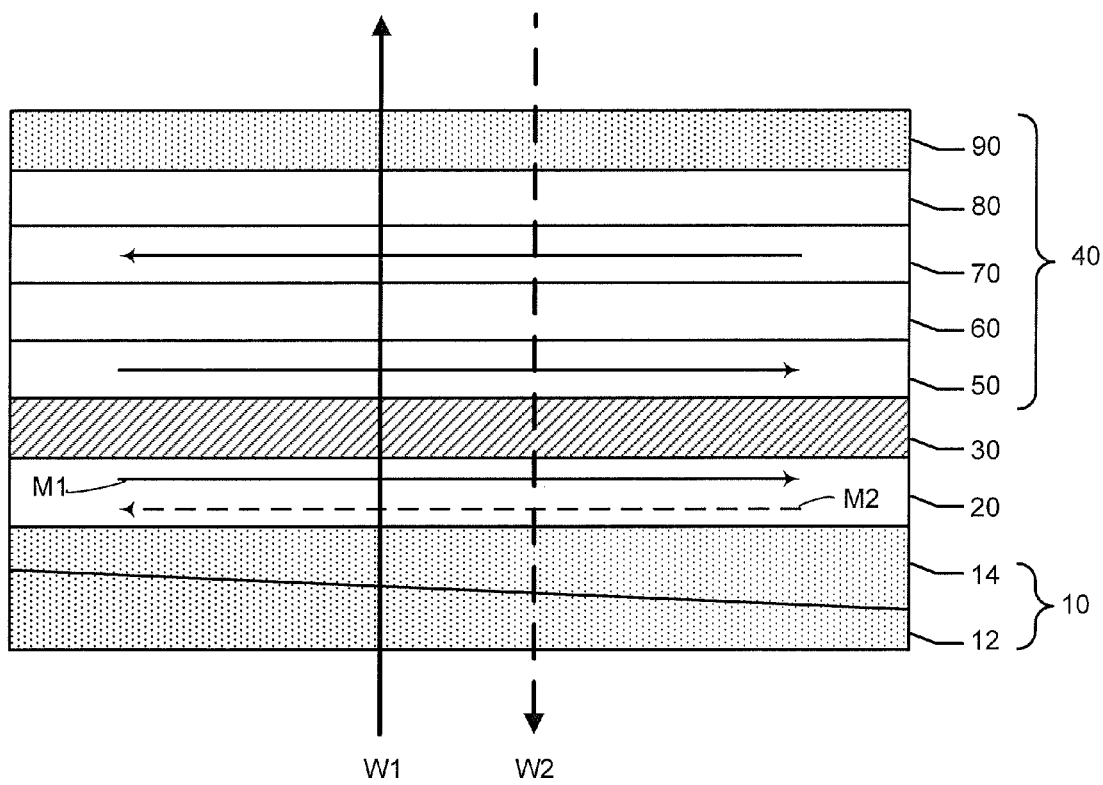
FIG. 3 schematically illustrates a method for programming a MRAM memory cell having the magnetic tunnel junction device of FIG. 2, according to an aspect of the invention.

FIG. 3 schematically illustrates a method for programming a MRAM memory cell having the magnetic tunnel junction device of FIG. 2, according to an aspect of the invention. As generally depicted in FIG. 3, the resistance of the magnetic tunnel junction 200 stack is modulated by applying a first write current W1 in a first direction (from bottom to top) through the stack 200 or by applying a second write current W2 in a second direction (from top to bottom), opposite the first direction, through the stack 200, to switch the magnetization orientation of the magnetic free layer 20 between from a first in-plane direction M1 (pointing right) to a second in-plane direction M2 (pointing left), opposite the first in-plane direction M1.

More specifically, as depicted in FIG. 3, when a write current W1 is applied in the direction shown, the magnetic moment of the magnetic free layer 20 is switched so that the in-plane magnetic orientation M1 of the magnetic free layer 20 points to the right in a direction "parallel" to the in-plane magnetic orientation of the first magnetic pinned layer 50. In this state, the magnetic tunnel junction 200 is in a first (low resistance) data state (e.g., logic 1). While in the first data state, the magnetization orientation of the free magnetic layer 20 remains in plane, and parallel, with a magnetization orientation of the first pinned layer 50 such that a resistance of the MTJ stack is in a low resistance state.

In FIG. 3, the second magnetic pinned layer 70 is shown to have an in-plane magnetization that points to the left, while the first magnetic pinned layer 50 is shown to have an in-plane magnetization that points to the right, such that the in-plane magnetizations of the first and second magnetic pinned layers 50 and 70 are anti-parallel. In this exemplary embodiment, the second magnetic pinned layer 70 does not significantly contribute to the magnetoresistance characteristics of the magnetic tunnel junction stack 200, but the second magnetic pinned layer 70 serves (in conjunction with the coupling layer 60) to pin the in-plane magnetization of the first magnetic pinned layer 50 to the right. This fixed in-plane magnetization of the first magnetic pinned layer 50 is parallel to the in-plane magnetization M1 of the magnetic free layer 20 while the device 200 is in the first data state (e.g., logic 1).

As further shown in FIG. 3, when the second write current W2 is applied in the direction shown, the magnetic moment of the magnetic free layer 20 is switched so that the in-plane magnetic orientation M2 of the magnetic free layer 20 points to the left in a direction "anti-parallel" to the in-plane magnetic orientation of the first magnetic pinner layer 50. In this state, the magnetic tunnel junction 200 is in a second (high resistance) data state (e.g., logic 0). While in the second data state, the magnetization orientation of the free magnetic layer 20 remains in plane, and anti-parallel, with a magnetization orientation of the first pinned layer 50 such that a resistance of the MTJ stack is in a high resistance state.

In either data state, a reading operation can be performed to determine the data state (e.g., logic 1 or logic 0) of an MRAM memory cell having the magnetic tunnel junction device of FIG. 2. For example, a read current, less than the write current, is applied to read the resistance state (high or low) of the MTJ device 200. A read current is applied to flow through the MTJ stack 200 from top to bottom or from bottom to top. The resistance state of the stack 200 depends on the relative magnetic orientations (directions of magnetic moments) of the magnetic free layer 20 and the first magnetic pinned layer 50. If the magnetic orientations are parallel, the resistance of the MTJ stack 200 is relatively low. If the magnetic orientations are anti-parallel, the resistance of the MTJ stack 200 is relatively high. Measuring the voltage across the MTJ structure 200, corresponding to the applied read current, allows for calculation of the resistance across the MTJ stack 200 according to Ohms law. In an alternate embodiment, a read voltage is applied across the MTJ stack 200 and a current is measured from which the resistance of the MTJ stack 200 is calculated.

Figure 5:
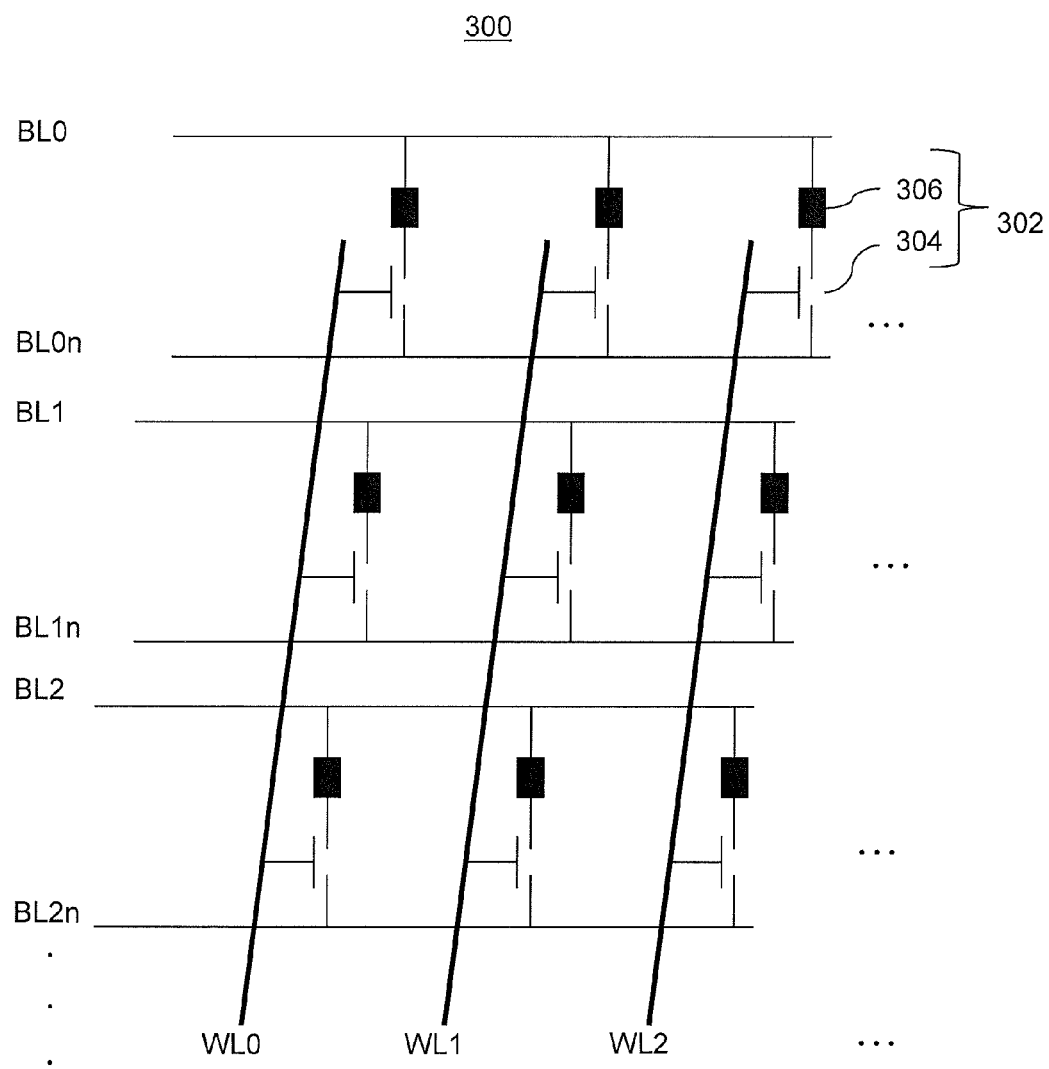
FIG. 5 schematically illustrates a MRAM architecture comprising memory cells with MTJ stack structures that can be constructed according to principles of the invention.

As noted above, an MTJ stack structure according to principles of the invention may be used for constructing MRAM memory chips. FIG. 5 schematically illustrates a MRAM architecture comprising an array of memory cells that may be formed having MTJ stack structures according to principles of the invention. FIG. 3 depicts at least a portion of an exemplary MRAM array 300 having a plurality of memory cells 302. Each memory cell 302 comprises an access device 304 and an MTJ stack 306. Each memory cell 302 is coupled between bit line pair, e.g., BL0/BL0n, BL1/BL1n, BL2/BL2n, . . . , and connected to one of a plurality of word lines WL0, WL1, WL2, . . . . In each memory cell 302, the MTJ stack 306 serves as a storage element that programmed in one of a high or low resistive state as discussed above with reference to FIG. 3. Moreover, in each memory cell 302, the access device 304 is coupled to the storage element 306, and operative to control access to the memory cell 302. The access devices 304 may be metal-oxide-semiconductor (MOS) devices having a source connected to a first terminal of the MTJ stack 306, a drain coupled to the corresponding complementary bit line BL)n, BL BL1n, BL2n, . . . , and a gate coupled to a corresponding one of the word lines WL0, WL1, WL2, . . . , to receive a control signal for selectively accessing the memory cell 302. A second terminal of the MTJ stack 306 is connected to one of the bit lines BL0, BL1, BL2, . . . . Respective control signals for selectively accessing the memory cells 302 may be generated by, for example, row and/or column circuitry (not explicitly shown) included in the MRAM circuit (e.g., row address demultiplexer), and sense amplifier circuitry may be connected to the bit lines to apply the necessary control currents and voltages for reading and writing to the memory cells 302, using known circuitry and control methods.

Further aspects of the present invention provide magnetic tunnel junction devices and methods for operating magnetic tunnel junction devices, which can be utilized in integrated circuits with various analog and digital circuitry. In particular, integrated circuit dies can be fabricated having magnetic tunnel junction devices and other semiconductor devices such as a field-effect transistors, bipolar transistors, metal-oxide-semiconductor transistors, diodes, resistors, capacitors, inductors, etc., forming analog and/or digital circuits. The magnetic tunnel junction devices can be formed upon or within a semiconductor substrate, the die also comprising the substrate. An integrated circuit in accordance with the present invention can be employed in applications, hardware and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
   a composite seed layer formed on a substrate; and
   a single conformal magnetic free layer formed on the composite seed layer;
   wherein the composite seed layer comprises:
      a first seed layer obliquely formed with an incident angle from a surface normal of the substrate along a first direction of the substrate; and
      a second seed layer obliquely formed with the incident angle on the first seed layer along a second direction of the substrate, opposite the first direction, wherein the composite seed layer with the obliquely formed first and second seed layers induces an in-plane magnetic anisotropy Hk of the single conformal magnetic free layer, and wherein the obliquely formed first and second seed layers are formed of non-magnetic material.

2. The device of claim 1, wherein the incident angle is about 15 degrees to about 25 degrees.

3. The device of claim 1, wherein the first and second seed layers are formed of a material having a HCP (hexagonal close packed) crystalline structure.

4. The device of claim 1, wherein the first and second seed layers are formed of Ru (Ruthenium).

5. The device of claim 1, wherein the magnetic free layer is formed of a composition of Co (Cobalt) and Fe (Iron).

6. The device of claim 1, further comprising a layer of MgO (magnesium oxide) formed on top of the magnetic free layer.

7. A magnetic tunnel junction device, comprising:
   a composite seed layer formed on a substrate wherein the composite seed layer comprises a first seed layer obliquely formed with an incident angle from a surface normal of the substrate along a first direction of the substrate, and a second seed layer obliquely formed with the incident angle on the first seed layer along a second direction of the substrate, opposite the first direction;
   a single conformal magnetic free layer formed on the composite seed layer;
   a tunnel barrier layer formed on the magnetic free layer; and
   a second magnetic layer disposed over the tunnel barrier layer,
   wherein the composite seed layer with the obliquely formed first and second seed layers induces an in-plane magnetic anisotropy Hk of the single conformal magnetic free layer, and wherein the obliquely formed first and second seed layers are formed of non-magnetic material.

8. The magnetic tunnel junction device of claim 7, wherein the incident angle is about 15 degrees to about 25 degrees.

9. The magnetic tunnel junction device of claim 7, wherein the first and second seed layers are formed of a material having a HCP (hexagonal close packed) crystalline structure.

10. The magnetic tunnel junction device of claim 7, wherein the first and second seed layers are formed of Ru (Ruthenium).

11. The magnetic tunnel junction device of claim 7, wherein the magnetic free layer is formed of a composition of Co (Cobalt), and Fe (Iron).

12. The magnetic tunnel junction device of claim 7, wherein the tunnel barrier layer is formed with MgO (magnesium oxide).

13. The magnetic tunnel junction device of claim 7, wherein the second magnetic layer is formed of a magnetic material including Co (cobalt), Fe (iron) or B (boron), or a combination thereof.

14. The magnetic tunnel junction device of claim 7, further comprising:
   a coupling layer formed on the second magnetic layer;
   a third magnetic layer formed on the coupling layer;
   an antiferromagnetic layer formed on the third magnetic layer.

15. The magnetic tunnel junction device of claim 14, wherein the coupling layer is formed of Ru.

16. The magnetic tunnel junction device of claim 14, wherein the antiferromagnetic layer is formed of PtMn.

17. An MRAM (Magnetoresistive Random Access Memory) device comprising an array of memory cells, wherein each memory cell comprises an access transistor and a magnetic junction tunnel device as claimed in claim 7.

18. A method for fabricating a semiconductor device, comprising:
   forming a composite seed layer on a substrate; and
   forming a single conformal magnetic free layer on the composite seed layer;
   wherein forming the composite seed layer comprises:
      obliquely depositing a first seed layer with an incident angle from a surface normal of the substrate along a first direction of the substrate; and
      obliquely depositing a second seed layer obliquely with the incident angle on the first seed layer along a second direction of the substrate, opposite the first direction, wherein the composite seed layer with the obliquely formed first and second seed layers induces an in-plane magnetic anisotropy Hk of the single conformal magnetic free layer, and wherein the obliquely formed first and second seed layers are formed of non-magnetic material.

19. The method of claim 18, wherein the incident angle is about 15 degrees to about 25 degrees.

20. The method of claim 18, wherein first and second seed layers are formed of Ru (Ruthenium).

21. The method of claim 18, wherein the magnetic free layer is formed of a composition of Co (Cobalt) and Fe (Iron).

* * * * *